United States Patent
Faust et al.

(10) Patent No.: US 7,655,555 B2
(45) Date of Patent: Feb. 2, 2010

(54) IN-SITU CO-DEPOSITION OF SI IN DIFFUSION BARRIER MATERIAL DEPOSITIONS WITH IMPROVED WETTABILITY, BARRIER EFFICIENCY, AND DEVICE RELIABILITY

(75) Inventors: Richard A. Faust, Plano, TX (US); Qing-Tang Jiang, Austin, TX (US); Jiong-Ping Lu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1563 days.

(21) Appl. No.: 09/895,520

(22) Filed: Jun. 28, 2001

(65) Prior Publication Data
US 2002/0001944 A1 Jan. 3, 2002

Related U.S. Application Data

(60) Provisional application No. 60/221,248, filed on Jul. 27, 2000.

(51) Int. Cl.
*H01L 21/4763* (2006.01)
*H01L 21/44* (2006.01)
*H01L 21/28* (2006.01)

(52) U.S. Cl. .................. 438/627; 438/643; 438/653; 438/570

(58) Field of Classification Search .............. 438/632, 438/643, 653, 927, 570, 580, 581, 582, 583, 438/627
See application file for complete search history.

(56) References Cited

U.S. PATENT DOCUMENTS

| | | | | | |
|---|---|---|---|---|---|
| 4,201,999 | A | * | 5/1980 | Howard et al. | 257/486 |
| 4,829,363 | A | * | 5/1989 | Thomas et al. | 257/751 |
| 4,873,205 | A | * | 10/1989 | Critchlow et al. | 438/647 |
| 5,686,355 | A | * | 11/1997 | Sumi et al. | 438/654 |
| 5,796,166 | A | * | 8/1998 | Agnello et al. | 257/751 |
| 5,926,740 | A | * | 7/1999 | Forbes et al. | 438/763 |
| 5,980,265 | A | * | 11/1999 | Tischler | 438/93 |
| 6,093,966 | A | * | 7/2000 | Venkatraman et al. | 257/751 |
| 6,153,519 | A | * | 11/2000 | Jain et al. | 438/681 |
| 6,181,012 | B1 | * | 1/2001 | Edelstein et al. | 257/762 |
| 6,246,082 | B1 | * | 6/2001 | Mitarai et al. | 257/295 |
| 6,376,371 | B1 | * | 4/2002 | Jain et al. | 438/681 |
| 6,399,496 | B1 | * | 6/2002 | Edelstein et al. | 438/687 |
| 6,500,742 | B1 | * | 12/2002 | Chern et al. | 438/582 |
| 6,661,057 | B1 | * | 12/2003 | Dawson et al. | 257/336 |
| 6,797,608 | B1 | * | 9/2004 | Lin | 438/627 |

* cited by examiner

*Primary Examiner*—Chuong A. Luu
(74) *Attorney, Agent, or Firm*—Jacqueline J. Garner; Wade J. Brady, III; Frederick J. Telecky, Jr.

(57) ABSTRACT

A copper interconnect having a transition metal-silicon-nitride barrier (106). A transition metal-nitride is co-deposited with Si by reactive sputtering in a Si containing ambient to form barrier (106). The copper (110) is then deposited over the transition metal-silicon-nitride barrier (108) with good adhesion.

11 Claims, 2 Drawing Sheets

IN-SITU CO-DEPOSITION OF SI IN DIFFUSION BARRIER MATERIAL DEPOSITIONS WITH IMPROVED WETTABILITY, BARRIER EFFICIENCY, AND DEVICE RELIABILITY

This application claims priority under 35 USC §119(e)(1) of provisional application No. 60/221,248 filed Jul. 27, 2000.

CROSS-REFERENCE TO RELATED APPLICATIONS

The following co-pending application is related and hereby incorporated:

Ser. No. 60/150,996 Filed Aug. 27, 1999 Inventors Lu et al.

FIELD OF THE INVENTION

The invention is generally related to the field of interconnect layers in semiconductor devices and more specifically to diffusion barriers for copper interconnect layers.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a damascene process, the IMD is formed first. The IMD is then patterned and etched. The barrier layer 14 and a copper seed layer are then deposited over the structure. The barrier layer 14 is typically tantalum, tantalum nitride or some other binary transition metal nitride. The copper layer is deposited by electroplating over the seed layer. The copper is then chemically-mechanically polished (CMP'd) to remove the copper from over the IMD 16, leaving copper interconnect lines 18 as shown in FIG. 1. A metal etch is thereby avoided.

Barrier layer 14 is required because copper has high diffusivity. Copper interconnects totally rely on the encapsulating barrier materials to prevent copper from diffusing through to cause leakage and transistor poisoning. The basic requirements for the barrier materials are 1) good barrier efficiency, 2) good copper wettability, and 3) strong copper to barrier bonding. The most commonly used barrier materials to date are TiN, Ta, and TaN. TiN and Ta do not meet the first criterion very well although Ta is a little better than TiN. If TiN or Ta is used as the barrier material in copper interconnects, a relatively thick layer of barrier material is required in vias and trenches. This becomes less and less viable as device geometries shrink. TaN has near amorphous structure and therefore, it has a better barrier efficiency. However, TaN, does not meet the last two criteria well. Copper does not like to wet to TaN surfaces and tends to detach from TaN due to the weak bonding strength. This causes voids in the copper during the via fill and negatives impacts the electromigration performance. Metal-silicon-nitrides have better wetting properties. Unfortunately, current methods of forming these metal-silicon-nitrides are difficult to perform and result in a film having high resistivity.

SUMMARY OF THE INVENTION

The invention is a copper interconnect having a transition metal-silicon-nitride barrier. A transition metal-nitride is co-deposited with Si using a reactive sputter deposition in a Si-containing ambient. The copper is then deposited over the transition metal-silicon-nitride barrier layer.

An advantage of the invention is providing a diffusion barrier having improved adhesion with copper, low resistance, and that can be fabricated using a method that offers higher throughput and is easy to implement.

This and other advantages will be apparent to those of ordinary skill in the art having reference to the specification in conjunction with the drawings.

DETAILED DESCRIPTION OF THE EMBODIMENTS

The invention will now be described in conjunction with a copper interconnect layer. Those of ordinary skill in the art will realize that the benefits of the invention may be applied to diffusion barriers in general where improved wetting property is desired without a significant increase in resistance.

Figure 1:
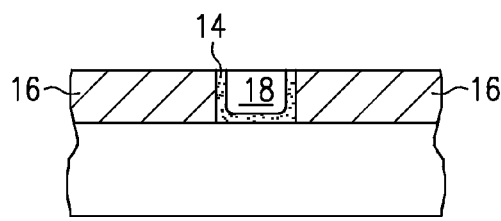
FIG. 1 is a cross-sectional diagram of a prior art copper interconnect layer.
Figure 2:
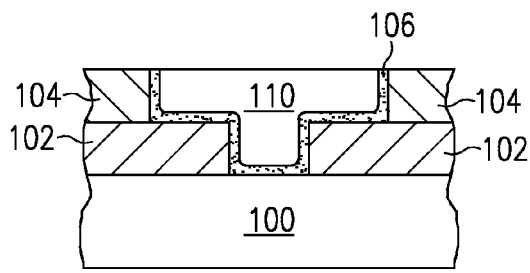
FIG. 2 is a cross-sectional diagram of a copper interconnect layer having a transition metal-silicon-nitride diffusion barrier according to the invention.

A transition metal-silicon-nitride diffusion barrier 106, according to the invention, is shown in FIG. 2. An interlevel dielectric (ILD) 102 and intrametal dielectric (IMD) 104 are located over a semiconductor body 100. Semiconductor body 100 comprises transistors (not shown) and isolation structures (not shown) formed herein. Semiconductor body 100 may also comprise other devices and structures as are known in the art. Semiconductor body 100 may include additional interconnect layers (not shown) and/or additional interconnect layers may be formed over IMD 104.

Suitable materials for ILD 102 and IMD 104 are known in the art. ILD 102 and IMD 104 may comprise the same or differing materials. For example, ILD 102 and IMD 104 may comprise a PETEOS (Plasma Enhanced TetraEthyOxySilane) oxide or a low-k material such as xerogel, FSG (fluorine-doped silicate glass), HSQ (Hydrogen SilesQuixane) organic low-k materials, or a combination thereof.

Diffusion barrier 106 is located within in ILD 102 and IMD 104. Diffusion barrier 106 comprises a transition metal-silicon-nitride. For example, diffusion barrier 106 may comprise TaSiN or WSiN. Copper 110 is located over barrier 106. The transition metal-silicon-nitride diffusion barrier 106 has low resistance and excellent wettability to dielectrics such as FSG. While transition metal-nitrides have poor wettability to copper. The metal-silicon-nitrides, on the other hand, have good wettability to copper. While some metal-silicon-nitrides have higher resistivity, metal-silicon nitrides formed according to the invention have comparable resistivity to metal-nitrides as long as the N:Si ratio is kept low (i.e., N:Si<0.6). High N content is believed to cause the formation of $Si_3N_4$. $Si_3N_4$ has higher resistivity and increases the total resistivity of the metal-silicon-nitride film.

TABLE I

Table 1 is a comparison of Ta, TaN and TaSiN for copper metallization.

| Barrier | Ta | TaN | TaSiN |
|---|---|---|---|
| Crystallinity | strong | weak | amorpho |
| Stress | −2100 | −2100 | −500 |
| Sidewall Agglomeration | small islands | large islands | near continuous |
| RMS (Å) | 35 | 400 | 8 |
| Resistivity (μΩ-cm) | 160–170 | ~200-dielectric | ~220-dielectric |

Figure 4A:
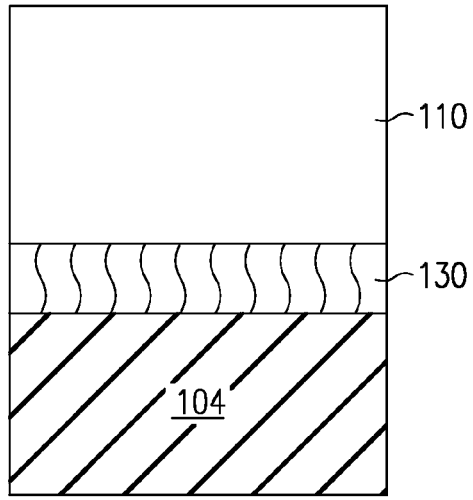
FIGS. 4A-4D are cross-sectional diagrams of a copper interconnect having a diffusion barrier of varying crystallinity.
Figure 4B:
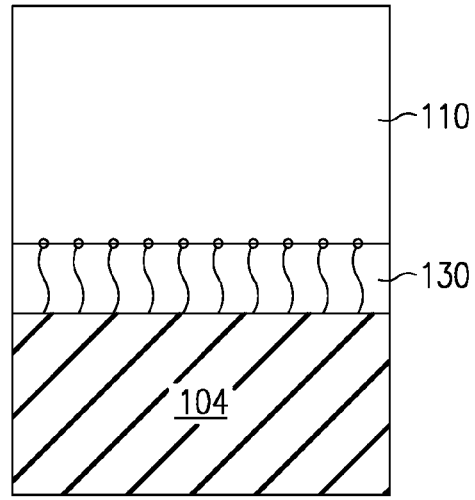
Figure 4C:
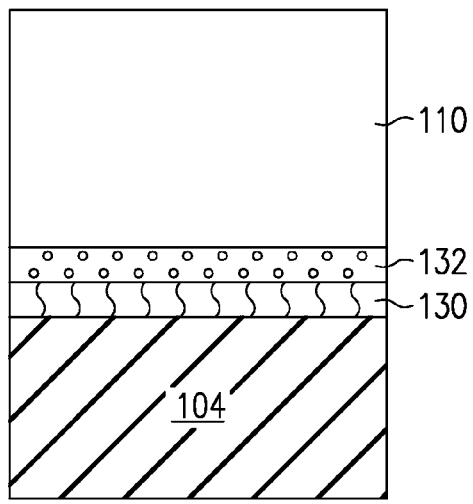
Figure 4D:
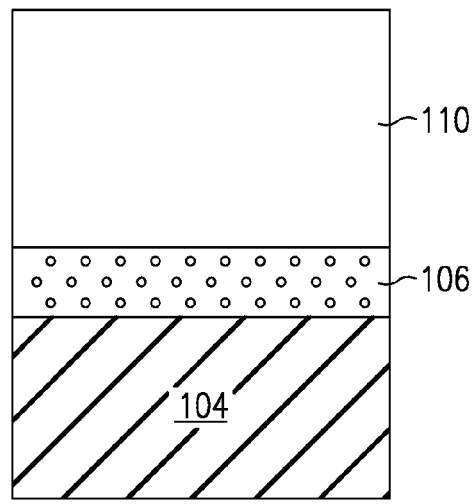

As shown in Table I, TaSiN is amorphous, whereas TaN is only near amorphous. Amorphous layers tend to be good barriers for copper because they do not have grain boundaries for the copper to diffuse through. FIGS. 4A-4D show a copper interconnect with a diffusion barrier of varying crystallinity. FIG. 4A represents a TaN barrier 130 having grain barriers through which the copper 110 could diffuse. FIG. 4B represents a TaN barrier 130 with a small amount of silicon at the copper-diffusion barrier interface. FIG. 4C illustrates an amorphous top layer 132 (e.g., TaSiN) and crystalline bottom layer 130 (e.g. TaN). FIG. 4D illustrates the invention wherein the diffusion barrier 106 is totally amorphous.

The sidewall agglomeration for copper is also very good for TaSiN. On TaN, copper forms large islands and thus, voids in the copper which are bad for electromigration. On Ta, copper forms small islands, which are better, but not as good as the near continuous layer of TaSiN.

Figure 3A:
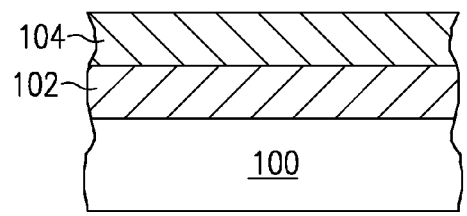
FIGS. 3A-3D are cross-sectional diagrams of the interconnect of FIG. 2 at various stages of fabrication, according to the invention.

A method for forming diffusion barrier 106, according to the invention, will now be discussed with reference to FIGS. 3A-E. Referring to FIG. 3A, semiconductor body 100 is processed through the formation of ILD 102 and IMD 104. This includes the formation of isolation structures, transistors and other desired devices, as is known in the art. Suitable methods for forming ILD 102 and IMD 104 are known in the art. ILD 102 and IMD 104 may comprise the same or differing materials. For example, ILD 102 and IMD 104 may comprise a PETEOS oxide or a low-k material such as xerogel, FSG, HSQ, organic low-k materials or a combination thereof. IMD 104 may be part of the first interconnect layer or any subsequent interconnect layer.

Figure 3B:
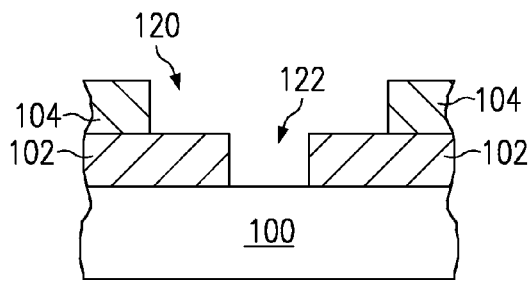

Referring to FIG. 3B, a trench 120 is etched in IMD 104. If vias are desired and have not already been formed, a dual damascene process may be used to form both trench 120 in IMD 104 and a via 122 in ILD 102. If via connections have already been fabricated, only trench 120 is etched.

Figure 3C:
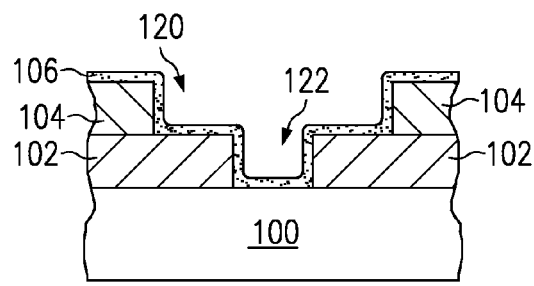

Next, a diffusion barrier 106 is formed on the surface of IMD 104 and on the surface of trench 120, as shown in FIG. 3C. Diffusion barrier 106 is also formed on the surface of via 122, if a via connection has not already been formed. Diffusion barrier 106 comprises a transition metal-silicon-nitride. For example, diffusion barrier 106 may comprise TaSiN or WSiN. The thickness of diffusion barrier 106 is on the order of 250 Å on flat field. The thickness on the sidewall will be considerably less (e.g., 20-40 Å) depending on the topography of the structure. The more aggressive the structure, the poorer the sidewall coverage is.

Transition metal-silicon nitride is formed by co-depositing Si and the transition metal-nitride. The transition metal-nitride is deposited by reactive sputtering. A Si-containing ambient may be used to co-deposit the Si. As an example, silicon-containing gases such as $SiH_4$, $Si_2H_6$, or $Si(NR_3)_4$, where R is an organic ligand may be used with a Ta target and a nitrogen-containing gas. The amount of Si incorporated in the barrier film 106 can be controlled by the gas flow of the silicon containing gas. This method gives total flexibility of the Si concentration in the barrier film 106. If desired, a linear or non-linear gradient of Si concentration can be generated inside the barrier film 106 by varying the cas flow during deposition. Alternatively, a TaSi target may be used.

The N:Si ratio is kept low. The low N:Si ratio results in lower sheet resistance. A sheet resistance monitor may be employed to ensure low resistance.

Barrier film 106 can be deposited using low temperatures (i.e., <~250° C.). Low temperatures are more compatible with multilayer interconnect processing technology.

Physical Vapor Deposition (PVD) systems are used for reactive sputtering. Modifications to the typical pump system of a PVD system are needed. The typical pump system uses a cryo pump. The cryo pump is not appropriate for the invention. A turbo pump should be added to accomplish the invention.

The transition metal-silicon-nitride film is totally amorphous and provides good wettability to the subsequently formed copper. Lower resistivity can be obtained by keeping the N:Si ratio low. For example, resistivities less than 250 μΩ/cm have been achieved. The above method for forming the transition metal silicon nitride is an in-situ process that allows higher throughput that ex-situ processes. No vacuum break is needed which eliminates the formation of a barrier oxide.

Figure 3D:
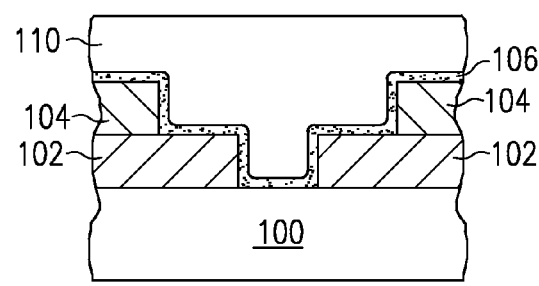

Referring to FIG. 3D, a copper layer 110 is formed on the transition metal-silicon-nitride barrier layer 106. Copper layer 110 may be formed by first forming a copper seed layer and then using an electroplating process to deposit the remaining copper. The silicon in barrier layer 106 may form a copper-silicide at the interface. The copper-silicide further improves adhesion and is expected to increase electromigration lifetimes.

The copper layer 110 and barrier layer 106 are then removed back, for example by CMP (chemical-mechanical polish) to substantially planar with IMD 104, as shown in FIG. 2.

The transition metal-silicon-nitride diffusion barrier 106 may be applied to the first or any subsequent copper interconnect layer. Furthermore, it may be applied to one, some, or all of the copper interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of fabricating a diffusion barrier, comprising the steps of:
   co-depositing silicon and a transition metal nitride using reactive sputtering in a silicon containing ambient to form a transition metal-silicon-nitride, wherein said silicon containing ambient is formed by supplying a silicon-containing gas.

2. The method of claim 1, wherein said transition metal-silicon nitride comprises TaSiN.

3. The method of claim 1, wherein said silicon-containing ambient is formed by supplying a silicon-containing gas selected from the group consisting of $SiH_4$, $Si_2H_6$, and $Si(NR_3)_4$, where R is an organic ligand.

4. The method of claim 3, wherein nitrogen is introduced during the step of co-depositing via a nitrogen-containing gas, wherein a N:Si ratio is less than 0.6.

5. The method of claim 1, wherein said reactive sputtering uses a tantalum target.

6. The method of claim 1, wherein said transition metal-silicon-nitride has a flat field thickness on the order of 250 Å.

7. A method of fabricating an integrated circuit, comprising the steps of:
forming a dielectric layer over a semiconductor body;
etching a trench in said dielectric layer;
forming a transition metal-silicon-nitride layer over said dielectric layer including within said trench by reactive sputtering a transition metal nitride in a silicon-containing ambient formed by supplying a silicon-containing gas; and
forming a copper layer on said transition metal-silicon-nitride layer.

8. The method of claim 7, wherein said transition metal nitride comprises TaN.

9. The method of claim 7, wherein said silicon-containing ambient is formed by supplying a silicon-containing gas selected from the group consisting of $SiH_4$, $Si_2H_6$, and $Si(NR_3)_4$, where R is an organic ligand.

10. The method of claim 7, wherein said transition metal-silicon-nitride layer has a flat field thickness on the order of 250 Å.

11. The method of claim 7, wherein said reactive sputtering utilizes a Ta target and a nitrogen-containing gas; and wherein a N:Si ratio is less than 0.6.

* * * * *

UNITED STATES PATENT AND TRADEMARK OFFICE
CERTIFICATE OF CORRECTION

| | | |
|---|---|---|
| PATENT NO. | : 7,655,555 B2 | Page 1 of 1 |
| APPLICATION NO. | : 09/895520 | |
| DATED | : February 2, 2010 | |
| INVENTOR(S) | : Faust et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1078 days.

Signed and Sealed this

Twenty-eighth Day of December, 2010

David J. Kappos
*Director of the United States Patent and Trademark Office*